United States Patent [19]

Füldner

[11] Patent Number: 5,001,728
[45] Date of Patent: Mar. 19, 1991

[54] METHOD AND APPARATUS FOR DEMODULATING A BIPHASE SIGNAL

[75] Inventor: Friedrich Füldner, Villingen, Fed. Rep. of Germany

[73] Assignee: Deutsche Thomson-Brandt GmbH, Hannover, Fed. Rep. of Germany

[21] Appl. No.: 235,111

[22] Filed: Aug. 23, 1988

[30] Foreign Application Priority Data

Aug. 27, 1987 [DE] Fed. Rep. of Germany ....... 3728655

[51] Int. Cl.$^5$ ............................................ H04L 27/22
[52] U.S. Cl. ..................... 375/82; 379/310; 375/83
[58] Field of Search .................. 371/62; 329/104, 304, 329/310; 360/42, 43; 341/70, 71; 375/49, 55, 87, 88, 90, 95, 80, 82

[56] References Cited

U.S. PATENT DOCUMENTS

| | | | |
|---|---|---|---|
| 3,243,580 | 3/1966 | Welsh | 360/42 |
| 3,491,349 | 1/1970 | Sevilla et al. | 360/42 |
| 3,903,474 | 2/1975 | Wiley | 371/62 |
| 4,320,525 | 3/1982 | Woodward | 360/42 |
| 4,608,702 | 8/1986 | Hirzel et al. | 375/87 |

Primary Examiner—Benedict V. Safourek
Attorney, Agent, or Firm—Spensley Horn Jubas & Lubitz

[57] ABSTRACT

A binary encoded phase modulated signal (biphase signal) is demodulated by determining the period of time (T) elapsing between each two successive jumps in the level of the biphase signal; providing a clock frequency (B) approximately corresponding to the bit rate of the biphase signal with the aid of a clock generator; comparing the clock duration (1/B) of the clock frequency with the period of time (T) between each two jumps in level; and, with the aid of a sample and hold circuit controlled by the clock frequency (B), always ascertaining the logical value of the biphase signal and emitting a signal corresponding to the logical value whenever, immediately prior to a bit period, twice in succession, a value between 1/4 and 3/4 of 1/B is ascertained for the period of time (T), or a value between 3/4 and 5/4 of 1/B is ascertained for the period of time (T). Additionally, a signal characterizing interference can be emitted, or the output can be suppressed, if a value less than 1/4 of 1/B or greater than 5/4 of 1/B is ascertained as the period of time (T). This makes it possible, in the presence of a biphase signal, to recover the original data with high security in a relatively simple manner.

18 Claims, 3 Drawing Sheets

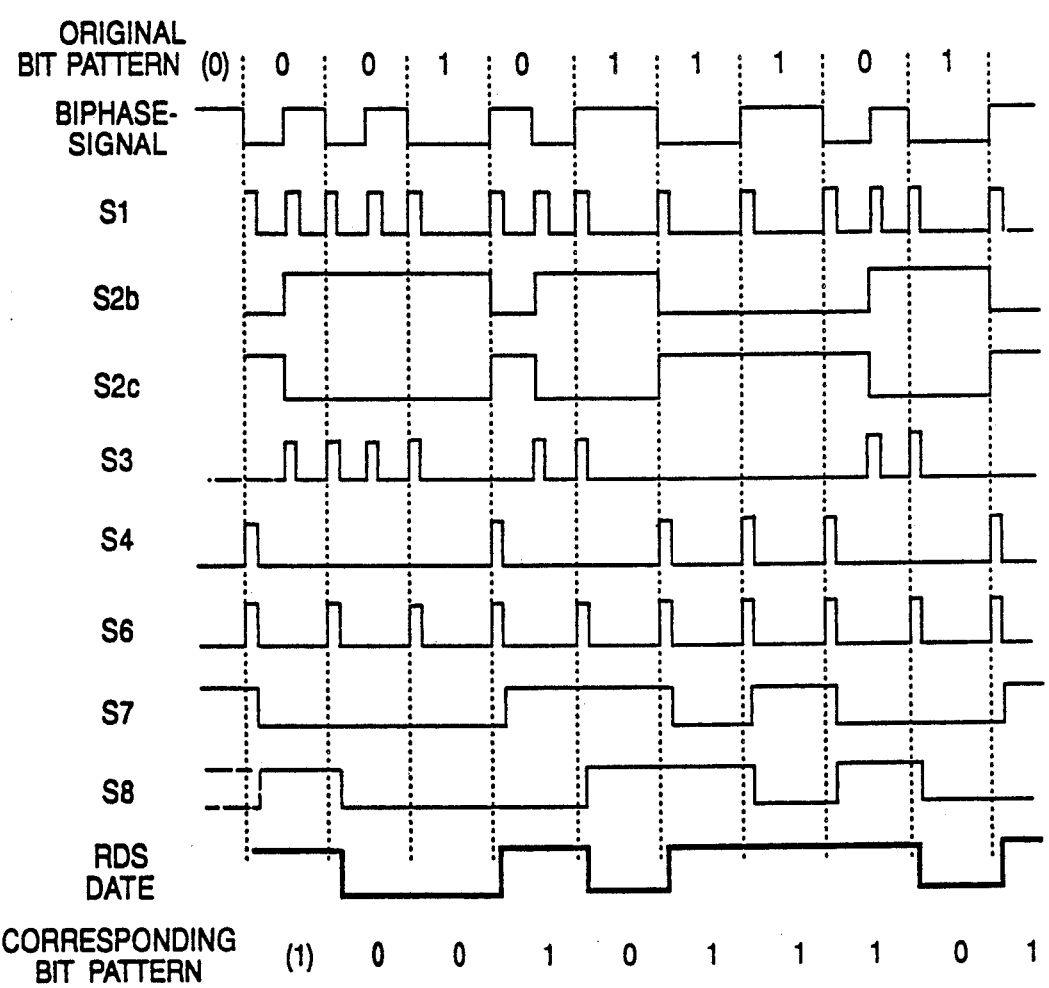

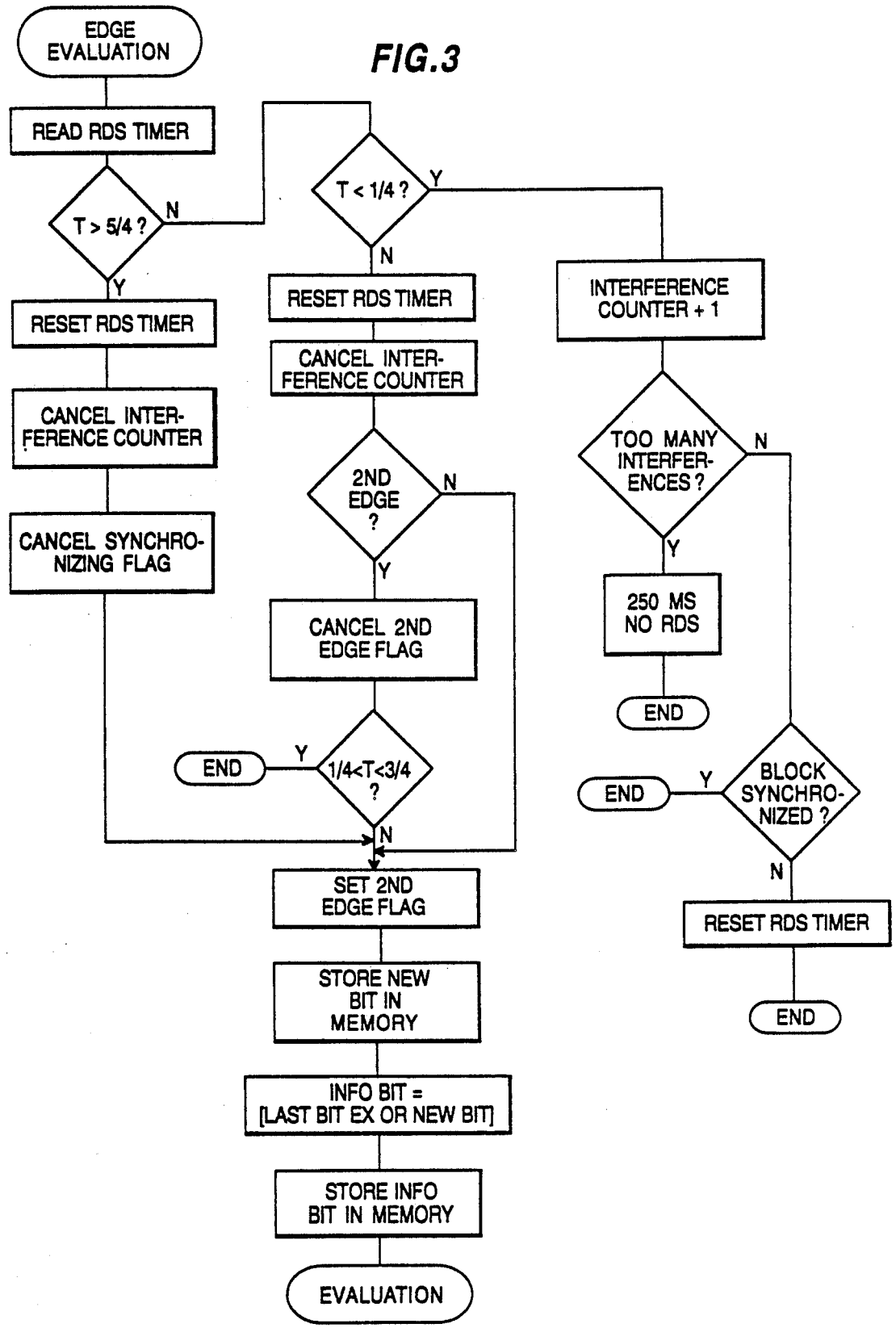

METHOD AND APPARATUS FOR DEMODULATING A BIPHASE SIGNAL

BACKGROUND OF THE INVENTION

The present invention relates to a method and apparatus for demodulating a binary encoded phase-modulated signal, or biphase signal.

An apparatus of this type is disclosed in the specifications of the European Broadcasting Union, Tech. 3224-E, Brussels, March 1984. A disadvantage of the known circuit is that for clocked recovery of the bit rate of the RDS (Radio Data System) biphase signal of 1187.5 Hz, an apparatus that functions very precisely is required.

SUMMARY OF THE INVENTION

A primary object of the present invention is to provide a method and apparatus for demodulating a biphase signal, by means of which the original data can be recovered with sufficient security, in a relatively simple manner.

The above and other objects are attained by a method and apparatus for demodulating a biphase signal, which is a binary encoded phase modulated signal which varies between two levels and which has a given bit rate, involving the following operations: determining the period of time (T) elapsing between each two successive jumps in level of the biphase signal; providing a clock signal at a clock frequency (B) at least approximately corresponding to the bit rate of the biphase signal; comparing the period (1/B) of the clock signal with the period of time (T) between each two jumps in biphase signal level; and ascertaining the logical value of each bit of the biphase signal under control of the clock signal and emitting an output signal corresponding to the logical value of each bit whenever, immediately before the respective bit period, the step of comparing results in a value for time (T) of between ¼B and ¾B twice in succession, or a value of between ¾B and 5/4B.

Further advantages, characteristics and details of the invention will become apparent from the ensuing detailed description of two exemplary embodiments which are illustrated in the drawing.

BRIEF DESCRIPTION OF THE DRAWING

FIG. 2 is a pulse diagram illustrating the signal waveforms at various points in the circuit shown in FIG. 1.

FIG. 3 is a flow chart illustrating an operating method according to the invention.

DESCRIPTION OF THE PREFERRED EMBODIMENTS

Figure 1:
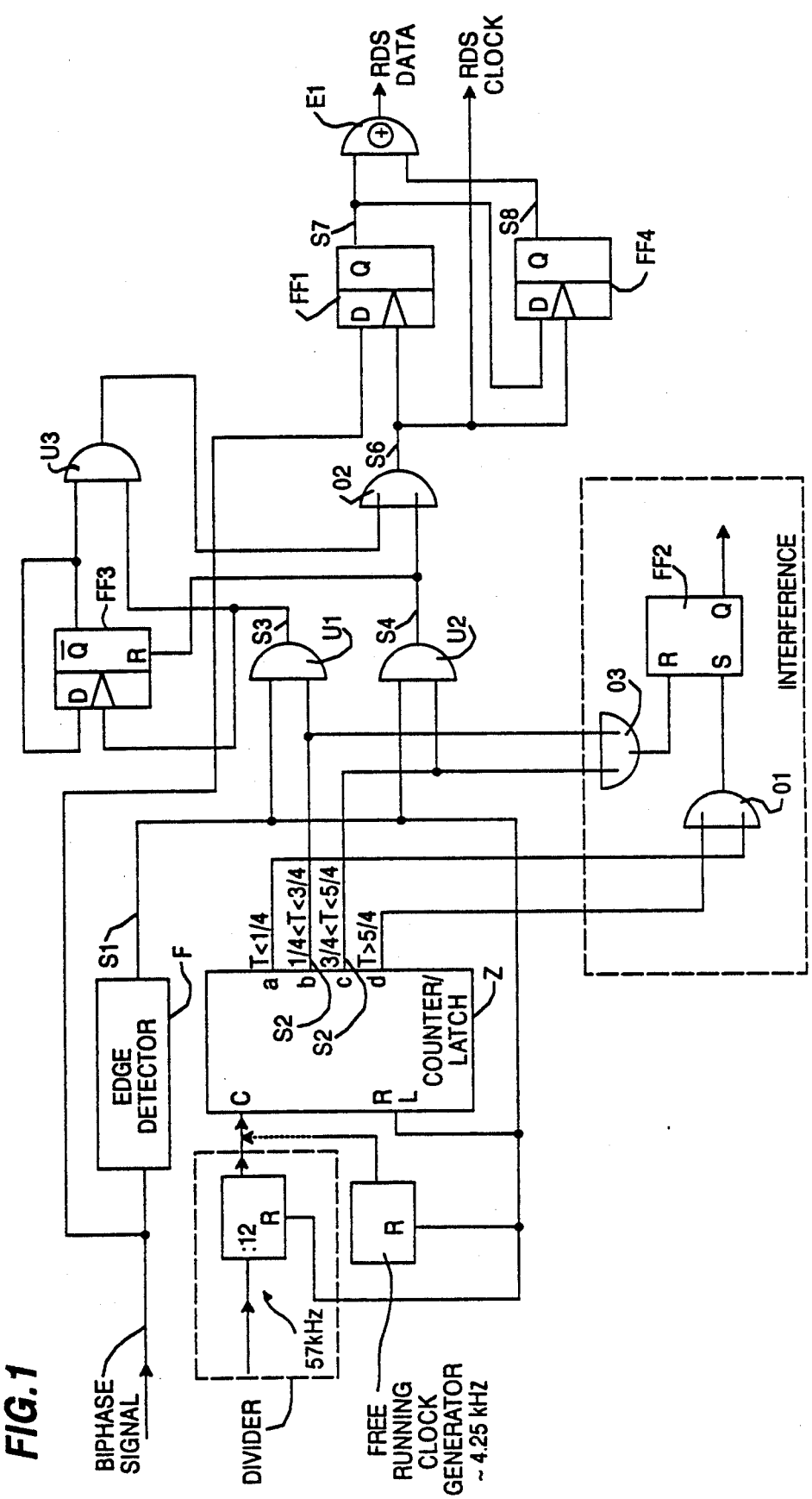
FIG. 1 is a block circuit diagram of one preferred embodiment of apparatus according to the invention for demodulating a biphase signal.

Both the circuit shown in FIG. 1 and the method, explained by the flow cart shown in FIG. 3, for demodulating a biphase signal are provided for radio equipment suitable for output of data in accordance with the aforementioned RDS (Radio Data System) standard.

On the transmitter side, the RDS signal is supplied to a biphase symbol generator via a differential encoder at a bit rate of 1187.5 Hz, and is added, on a 57 kHz auxiliary carrier, with phase modulation, to an FM multiplex signal with a suppressed auxiliary carrier.

On the receiver side, the 57 kHz signal is filtered out of the FM multiplex signal and supplied to a synchronous demodulator, after which it is present in the form of a biphase signal.

In FIG. 1 such an incoming biphase signal, converted to a digital signal as shown in FIG. 2, is supplied to an edge detector F. At the output of edge detector F, a signal S1 is present, which as FIG. 2 shows is composed of a short pulse at each instance when the biphase signal, also shown in FIG. 2, exhibits a jump in level. In FIG. 2, for better understanding, the original bit pattern associated with the biphase signal from the encoder is shown above the representation of the biphase signal.

From the output of edge detector F, the signal S1 is sent to the reset input R of a combined counter and memory Z and to the reset input R of a clock generator, which is either in the form of a free running clock generator or, as shown in FIG. 1 by the broken line box, is composed of a divider which divides the 57 kHz auxiliary carrier by 12. The output of the divider—or alternatively the output of the free running clock generator—is conducted to the clock input C of counter Z.

The output signal of edge detector F is also delivered to one input each of two AND gates U1 and U2. The counter/memory Z has four outputs a-d each providing an output signal based on a different criterion, as indicated by the legends associated with the various outputs. FIG. 2 shows the signal waveforms S2b and S2c appearing at outputs b and c.

At output a, a HIGH signal appears whenever the period of time T between two successive edges of the biphase signal is less than one-fourth (¼) of a bit period (1/bit rate). At the output d, a HIGH signal appears whenever the period of time T is ascertained to be greater than five-fourths (5/4) of the bit period. These two outputs are conducted to an OR gate 01, the output of which is supplied to the set (S) input of an RS flip-flop FF2. At the Q output of flip-flop FF2, a signal designated as "interference", indicating the presence of interference in the received biphase signal, is then present.

The output S2b of counter/memory Z carries a HIGH signal whenever the ascertained period of time T is between one-fourth (¼) and three-fourths (¾) of the bit period. This signal is fed to a second input of the AND gate U1, at the output of which a signal having the form S3 (see FIG. 2) appears, as well as to the clock input of a D flip-flop FF3 and to one input of an AND gate U3. The Q̄ output of flip-flop FF3 is carried to its D input as well as to a second input of the AND gate U3, the output of which has a signal having the form S5 and is supplied to one input of an OR gate 02.

The output S2c of counter/memory Z carries a HIGH signal whenever the period of time T is between three-fourths (¾) and five-fourths (5/4) of the bit period, and the associated signal waveform S2c is shown in FIG. 2. This signal is delivered to a second input of the AND gate U2, at the output of which a signal having the form S4 (see FIG. 2) is applied to the reset input R of flip-flop FF3 and to a second input of OR gate 02. At the output of this OR gate 02, a signal having the form S6 is emitted and signal S6 is fed to the clock inputs of flip-flop FF1 and of a further flip-flop FF4. Signal S6 also serves as an RDS clock output of the circuit arrangement.

The Q output of the flip-flop FF1 carries a signal of the form S7 which is fed to the input of an exclusive OR gate E1 as well as the D input of flip-flop FF4, the Q output of which has a signal of the form S8 which is applied to the second input of exclusive OR gate E1, at the output of which the RDS data are emitted.

The outputs 52b and 52c of counter/memory Z are also supplied to respective inputs of an OR gate 03, the output of which is connected to the reset input of flip-flop FF2, so that an interference signal emitted at this flip-flop FF2 is cancelled as soon as one of the inputs b or c again signal "normal conditions".

If a HIGH signal is emitted at the output 526, then the states of the biphase signal arriving at the circuit are changing at one-half the clock rate, since the scanning pulses S1 arrive at twice the frequency of the bit rate. During these periods, pulses S1 are divided by D flip-flop FF3, which is connected as a divider. If a HIGH signal is emitted at the output S2c, then flip-flop FF3 functioning as a divider is reset, which assures that the next time a HIGH signal appears at output S2b, the "correct" edge of the biphase signal will be taken over.

The two D flip-flops FF1 and FF4 and the exclusive OR gate E1 together form a differential decoder. The RDS data emitted at the output of the exclusive OR gate E1 are emphasized in FIG. 2 by bold print, and for clarification the applicable bit pattern is shown beneath it. It can be seen that this bit pattern corresponds to the original bit pattern.

The method shown in FIG. 3 for demodulating a biphase signal represents substantially the operation of the circuit described in detail above and shown in FIG. 1, while illustrating the manner in which the invention can be implemented with a microprocessor. The starting point, "edge evaluation", substantially corresponds to the point in FIG. 1 where the biphase signal enters, and the last step, "info bit=(last bit) EXOR (new bit)", located at the bottom of the left-hand portion of the flow chart surrounded by broken lines, corresponds to the point in FIG. 1 at which the RDS data are emitted, at the output of the exclusive OR gate E1.

The interference indication clears the '(Block-)synchronizing Flag' which is set in the 'evaluation routine'; it is not necessary to have a special flag in the software, because the software itself evaluates the RDS-data While the description above shows particular embodiments of the present invention, it will be understood that many modifications may be made without departing from the spirit thereof. The pending claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method for demodulating a biphase signal, which is a binary encoded phase modulated signal which varies between two levels and which has a given bit rate, comprising: detecting each jump in level of the biphase signal; providing a clock signal at a clock frequency at least approximately corresponding to the bit rate (B) of the biphase signal; comparing the period of the clock signal with the period of time (T) between each two successive jumps in biphase signal level; and ascertaining the logical value of each bit of the biphase signal under control of the clock signal and emitting an output signal corresponding to the logical value of each bit whenever, during the respective bit period, said step of comparing results in a value for time (T) of between $\frac{1}{4}$B and $\frac{3}{4}$B twice in succession, or a value of between $\frac{3}{4}$B and 5/4B.

2. A method as defined in claim 1 wherein the biphase signal is in a form in which it varies between two amplitude levels.

3. A method as defined in claim 2 wherein said step of providing a clock signal comprises restarting the clock signal from a defined starting position upon the appearance of each jump in level of the biphase signal.

4. A method as defined in claim 1 wherein the clock signal has a frequency at least approximately four times the bit rate of the biphase signal to be demodulated.

5. A method as defined in claim 1 wherein said step of detecting is performed by an edge detector to which the biphase signal is supplied and which generates a pulse at each edge of the biphase signal.

6. A method as defined in claim 5 wherein the clock signal frequency is an integral multiple of the bit rate, and said step of comparing is carried out by counting the clock signal cycles in a counter, and storing the count produces by the counter and then resetting the counter upon detection of each level jump of the biphase signal.

7. A method as defined in claim 1 further comprising emitting a fault signal indicating the presence of interference whenever said step of comparing results in a value for time (T) of less than $\frac{1}{4}$B or greater than 5/4B.

8. A method as defined in claim 7 further comprising interrupting said step of emitting an output signal for a predetermined period of time whenever a predetermined number of fault signals is emitted during a given period of time.

9. Apparatus for demodulating biphase signal, which is a binary encoded phase modulated signal which varies between two levels and which has a given bit rate, comprising: detecting means connected to receive the biphase signal for detecting each jump in level of the biphase signal; clock means providing a clock signal at a clock frequency at least approximately corresponding to the bit rate of (B) the biphase signal; comparing means connected to said detecting means and said clock means for comparing the period of the clock signal with the period of time (T) between each two successive jumps in biphase signal level; and circuit means connected to said comparing means for ascertaining the logical value of each bit of the biphase signal under control of the clock signal and for emitting an output signal corresponding to the logical value of each bit whenever, during the respective bit period, said comparing means indicates a value for time (T) of between $\frac{1}{4}$B and $\frac{3}{4}$B twice in succession, or a value of between $\frac{3}{4}$B and 5/4B.

10. Apparatus as defined in claim 9 wherein the biphase signal is in a form in which it varies between two amplitude levels.

11. Apparatus as defined in claim 10 wherein said clock means are controlled for restarting the clock signal from a defined starting position upon the appearance of each jump in level of the biphase signal.

12. Apparatus as defined in claim 9 wherein the clock signal has a frequency at least approximately four times the bit rate of the biphase signal to be demodulated.

13. Apparatus as defined in claim 9 wherein said detecting means comprise an edge detector which generates a pulse at each edge of the biphase signal.

14. Apparatus as defined in claim 13 wherein said comparing means comprise a counter connected to count the clock signal cycles and a memory connected for storing the current count state of said counter in response to each pulse received from said edge detector, and said counter and said clock means are connected to be reset to a starting position simultaneously.

15. Apparatus as defined in claim 9 further comprising means connected for emitting a fault signal indicating the presence of interference whenever, immediately before the respective bit period, said comparing means indicates a value for time (T) of less than $\frac{1}{4}$B or greater than 5/4B.

16. Apparatus as defined in claim 15 further comprising interrupting means connected to said means for emitting a fault signal for interrupting the output signal for a predetermined period of time whenever a predetermined number of fault signals is emitted during a given period of time.

17. Apparatus as defined in claim 9 wherein said comparing means and said circuit means comprise a digital circuit.

18. Apparatus as defined in claim 9 wherein said clock means, said comparing means and said circuit means comprise a microcomputer

* * * * *